(12) United States Patent
Choi et al.

(10) Patent No.: US 9,070,523 B2
(45) Date of Patent: Jun. 30, 2015

(54) RELAY MODULE FOR VEHICLE BATTERY SYSTEM

(71) Applicant: Hyundai Motor Company, Seoul (KR)

(72) Inventors: Yong Hwan Choi, Gyeonggi-do (KR); Dal Kim, Gyeonggi-do (KR); Jun Ho Bang, Gyeonggi-do (KR)

(73) Assignee: Hyundai Motor Company, Seoul (KR)

( * ) Notice: Subject to any disclaimer, the term of this patent is extended or adjusted under 35 U.S.C. 154(b) by 244 days.

(21) Appl. No.: 13/688,113

(22) Filed: Nov. 28, 2012

(65) Prior Publication Data

US 2013/0342292 A1     Dec. 26, 2013

(30) Foreign Application Priority Data

Jun. 26, 2012    (KR) .................. 10-2012-0068662

(51) Int. Cl.
| | |
|---|---|
| *H01H 50/00* | (2006.01) |
| *H01H 59/00* | (2006.01) |
| *H01H 9/16* | (2006.01) |
| *H01H 47/00* | (2006.01) |
| *H01H 51/06* | (2006.01) |

(52) U.S. Cl.
CPC ........... *H01H 50/00* (2013.01); *H01H 59/0009* (2013.01); *Y02T 10/6204* (2013.01); *Y02T 10/7005* (2013.01); *Y02T 10/6282* (2013.01); *H01H 9/167* (2013.01); *H01H 47/002* (2013.01); *H01H 51/065* (2013.01)

(58) Field of Classification Search
None
See application file for complete search history.

(56) References Cited

U.S. PATENT DOCUMENTS

| | | | | |
|---|---|---|---|---|
| 4,450,427 | A | * | 5/1984 | Gareis ......................... 338/32 H |
| 4,451,910 | A | * | 5/1984 | Simard ......................... 367/199 |
| 5,781,396 | A | * | 7/1998 | Fritschi et al. ................ 361/143 |
| 5,907,267 | A | * | 5/1999 | Reid et al. ........................ 335/17 |
| 2007/0087266 | A1 | * | 4/2007 | Bourke et al. ................ 429/159 |
| 2011/0266129 | A1 | * | 11/2011 | Inagaki ........................ 200/530 |

FOREIGN PATENT DOCUMENTS

| | | |
|---|---|---|
| JP | 2010-097826 A | 4/2010 |
| JP | 2010-161009 A | 7/2010 |
| JP | 2010-183795 A | 8/2010 |
| KR | 10-2012-0005729 A | 1/2012 |

\* cited by examiner

*Primary Examiner* — Melissa Koval
*Assistant Examiner* — Stephen G Armstrong
(74) *Attorney, Agent, or Firm* — Mintz Levin Cohn Ferris Glovsky and Popeo, P.C.; Peter F. Corless

(57) ABSTRACT

Disclosed herein is a relay module for a vehicle battery system. The relay module includes a movable unit configured to be moved by a magnetic field generated by a coil and a return spring within a relay. This movable unit controls a state of an electrical connection between relay electrodes. A microsensor installed between the movable unit and a fixed unit maintains a fixed location relative to the movable unit and is configured to induce a variation in an electrical physical quantity depending on a variation in a location of the movable unit relative to the fixed unit.

16 Claims, 4 Drawing Sheets

US 9,070,523 B2

RELAY MODULE FOR VEHICLE BATTERY SYSTEM

BACKGROUND OF THE INVENTION

1. Field of the Invention

The present invention relates, in general, to a relay module for a vehicle battery system and, more particularly, to technology related to a relay module which constitutes a part of a power relay assembly provided in a battery system mounted in a vehicle in order to supply power that is used to drive a vehicle, such as a hybrid vehicle or electronic vehicle referred to herein as environment-friendly vehicles.

2. Description of the Related Art

A battery system mounted in an environment-friendly vehicle is configured, as shown in FIG. 1, wherein a part indicated by a dotted line denotes a Power Relay Assembly (PRA) 500. Such a PRA 500 functions to guarantee a high degree of electrical insulation and electrical safety between vehicle systems, and also functions to prevent the occurrence of secondary significant accidents such as an electric shock caused by a high voltage or fire attributable to an electrical malfunction when an accident occurs. The PRA 500 may also be utilized to block dark current flowing from a high-voltage battery.

The above-described power relay assembly 500 is configured to include a positive (+) main relay 502, a negative (−) main relay 504, and an initial charging relay 506. Control of a relay ON sequence is implemented as follows: when the vehicle enters an ignition ON state, the negative main relay 504 is turned on and thereafter the initial charging relay 506 is turned on, thus enabling a peak current caused by a resistor to be restricted. After the positive main relay 502 is turned on as the charging of a capacitor has been completed, the initial charging relay 506 is turned off, completing the control of the relay ON sequence. Thereafter, control of a relay OFF sequence is implemented such that when the vehicle enters an ignition OFF state when in a state in which the initial charging relay 506 is turned off, the positive main relay 502 and the negative main relay 504 are simultaneously turned off.

In a Battery Management System (BMS), in order to diagnose faults such as the welding of relays operated as described above, diagnosis has been indirectly conducted using logic based on a series of operations involving each relay operated as described above. Such indirect diagnosis based on such logic is disadvantageous in that when the vehicle is started, only such faults as the welding of relays and a failure in the open circuit of the initial charging relay 506 can be diagnosed, so that when a problem occurs while a relay ON sequence is activated, it is difficult to determine whether the problem is caused by the relay itself, an error in the internal control circuit of the BMS, or a disconnection or short circuit of a control output wire. Further, even if the problem is determined to be with the relay itself, it is impossible to accurately determine whether the problem is caused by the welding of the contact point of the relay, whether the problem is caused by a failure in an open state, or wherein the problem has occurred, (i.e., the positive main relay 502, the negative main relay 504, and the initial charging relay 506).

Therefore, there are problems in that when a fault occurs in the relay that is part of the power relay assembly 500, it is impossible to immediately and accurately diagnose the problem. Furthermore, when only a specific relay is replaced based on the determination of a relay-related fault, there is a probability that an actual faulty relay may not have actually been replaced, thus causing the vehicle to be exposed to an unexpectedly dangerous situation. Additionally, when the vehicle is inspected, operating efficiency in fault recovery is greatly decreased in such a way that relays and a BMS must be individually replaced and then checked in relation to fault detection, thus resulting in temporal and economic loss.

The foregoing is intended merely to aid in the better understanding of the background of the present invention, and is not intended to mean that the present invention falls within the purview of the related art as already known to those skilled in the art.

SUMMARY OF THE INVENTION

Accordingly, the present invention has been made keeping in mind the above problems occurring in the prior art, and an object of the present invention is to provide a relay module for a vehicle battery system, which directly, accurately and promptly detect a fault in a relevant relay constituting part of a power relay assembly when the fault/problem/failure occurs in the relay, so that cost and time can be greatly reduced due to an improvement in the operating efficiency of fault recovery. Furthermore, exposure of a vehicle to unexpected dangerous situations can be prevented due to an improvement in the reliability of fault recovery. The present invention also can monitor the states of respective relays in real time, so that there is an improvement in the fault diagnosis performance of determining whether a fault lies in a failure in each relay itself, in a relay control circuit provided in a BMS, or in the short circuit or the disconnection of a control output wire, thus guaranteeing the safety of a vehicle system.

In order to accomplish the above object, the present invention provides a relay module for a vehicle battery system, including a movable unit configured to be moved by a magnetic field of a coil and a return spring within a relay and to control a state of an electrical connection between relay electrodes; and a microsensor installed between the movable unit and a fixed unit. The microsensor configured to maintain a fixed location relative to the movable unit, and to induce a variation in an electrical physical quantity depending on a variation in a location of the movable unit relative to the fixed unit.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Hereinafter, embodiments of the present invention will be described in detail with reference to the attached drawings.

It is understood that the tem "vehicle" or "vehicular" or other similar tem as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

Figure 1:
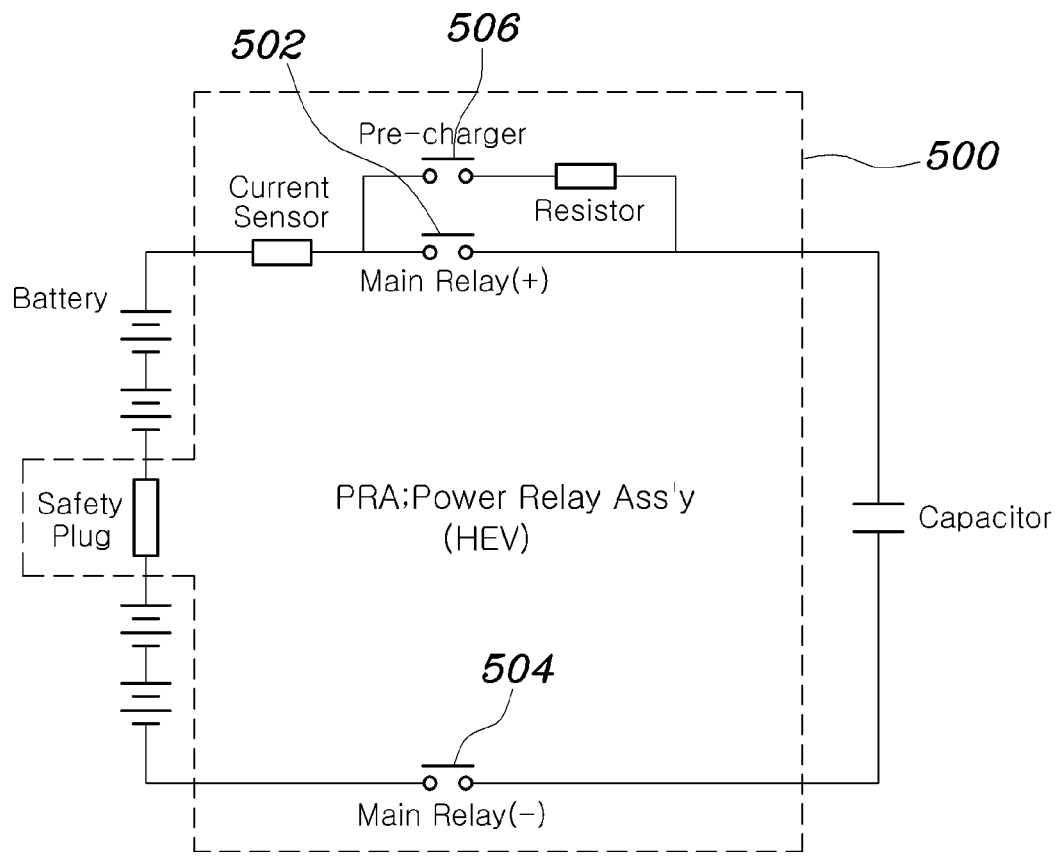
FIG. 1 is a diagram showing a conventional power relay assembly.
Figure 2:
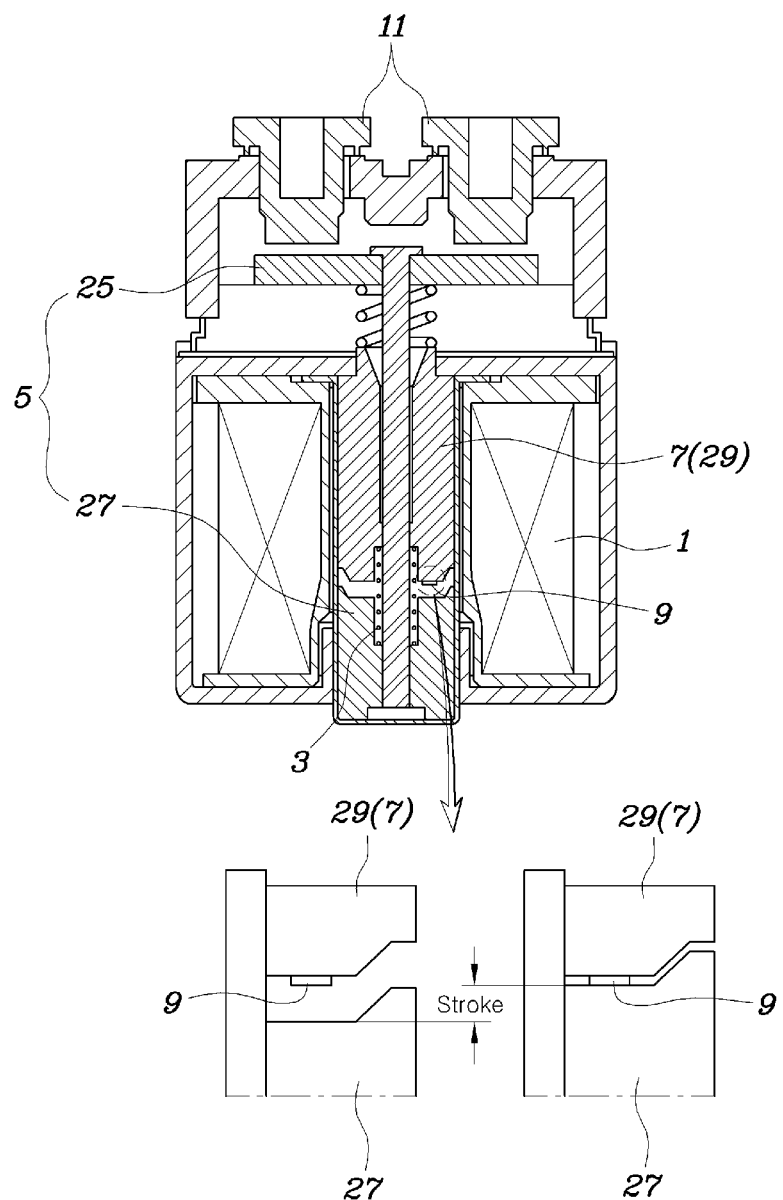
FIG. 2 is a diagram showing an exemplary a relay module for a vehicle battery system in accordance with a present invention.
Figure 3:
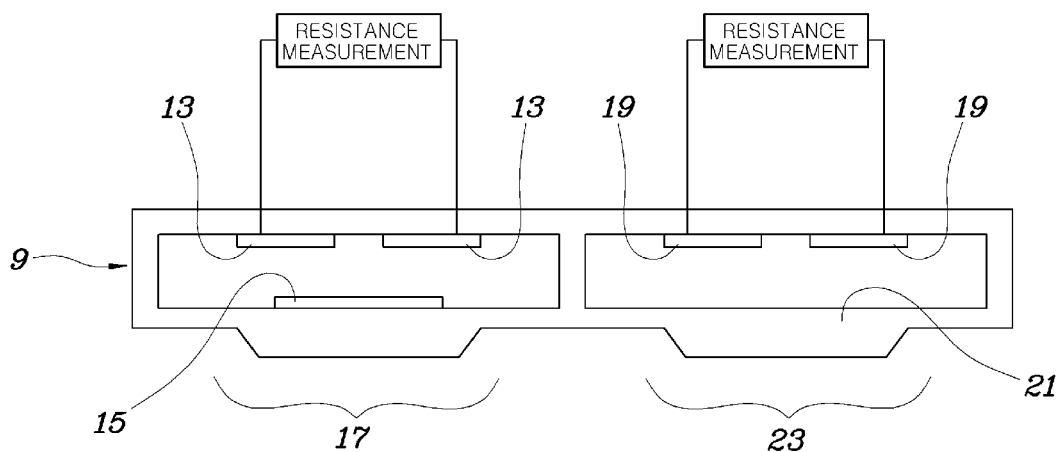
FIG. 3 is a diagram showing an exemplary configuration of the microsensor of FIG. 2.
Figure 4:
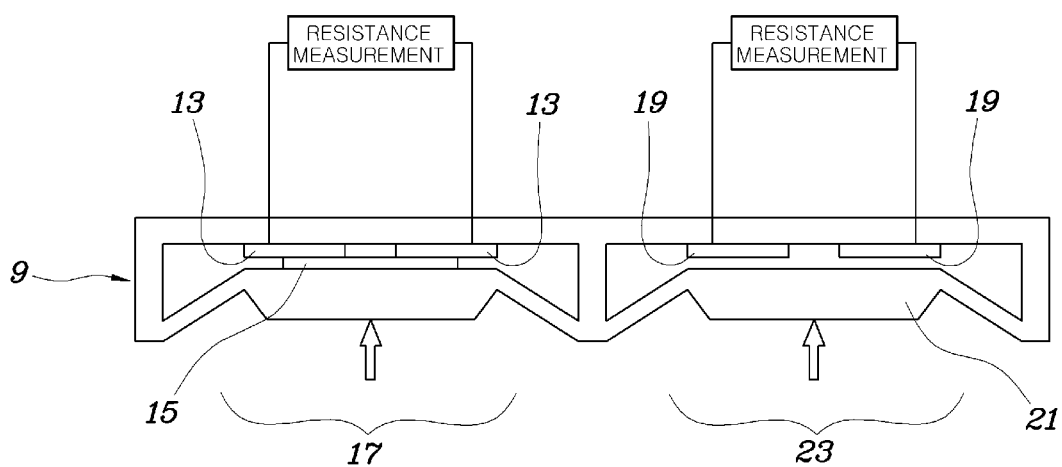
FIG. 4 is a diagram showing an exemplary variation in the state of the microsensor when the relay module is turned on, compared to FIG. 3.

Referring to FIGS. 2 to 4, an exemplary embodiment of the present invention includes a movable unit 5 configured to be moved by a magnetic field generated by a coil 1 and a return spring 3 within a relay, and control the state of electrical connection of relay electrodes 11. A microsensor 9 may be installed between the movable unit 5 and a fixed unit 7 for maintaining a fixed location relative to the movable unit 5, and configured to cause a variation in electrical physical quantities (e.g., resistance, current, etc.) depending on the variation in the location of the movable unit 5 relative to the fixed unit 7.

The microsensor 9 may be incredibly small size and operate in conjunction with the control operation of the relay electrodes 11 and may be contained in and/or integrated into a conventional relay, thus enabling the fault of the corresponding relay to be directly detected in real time.

The microsensor 9 may include two sensing electrodes 13 spaced apart from each other at a predetermined distance to enable the electrical resistance therebetween to be measured, and a sensing contact member 15 configured to, when the movable unit 5 is moved in a direction enabling the relay electrodes 11 to be electrically connected to each other, move in the same direction as the movable unit 5, thus enabling the two sensing electrodes 13 to be electrically connected to each other.

That is, the microsensor 9 may be configured such that when power is supplied to the coil 1 and then the movable unit 5 connects the relay electrodes 11 to each other, the sensing contact member 15 connects the two sensing electrodes 13 to each other and the measured electrical resistance is rapidly decreased, thus enabling the normal ON operation of the corresponding relay to be recognized by means of normal operations of the movable unit 5 and the relay electrodes 11. In contrast, when the supply of power to the coil 1 is interrupted and the movable unit 5 blocks the relay electrodes 11, the sensing contact member 15 blocks the two sensing electrodes 13 and then the electrical resistance is rapidly increased, thus enabling the normal OFF operation of the corresponding relay to be recognized by means of the normal operations of the movable unit 5 and the relay electrodes 11.

In the exemplary embodiment, as shown in FIG. 3, the microsensor 9 includes a measurement unit 17 and a reference unit 23. The measurement unit 17 includes two sensing electrodes 13 spaced apart from each other at a predetermined distance to enable the electrical resistance therebetween to be measured, and a sensing contact member 15 configured to, when the movable unit 5 is moved in a direction enabling the relay electrodes 11 to be electrically connected to each other, move in the same direction as the movable unit 5 and to enable the two sensing electrodes 13 to be electrically connected to each other. The reference unit 23 may be provided with two reference electrodes 19 spaced apart from each other a predetermined distance to enable the electrical resistance therebetween to be measured, and includes an operation unit 21 configured to, when the movable unit 5 is moved in the direction enabling the relay electrodes 11 to be electrically connected to each other, move in the same direction as the movable unit 5 while operating in conjunction with the measurement unit 17. In the exemplary embodiment of the present invention, the operation unit 21 may preferably be made of only a nonconductor that inhibits the reference electrodes 19 from being electrically connected.

That is, the microsensor 9 can be implemented using only the measurement unit 17, but the reference unit 23 is additionally provided in parallel with the measurement unit 17 so as to to more accurately and reliably determine the state of the relay. Here, the BMS is intended to determine the state of the corresponding relay in consideration of both a variation in the electrical resistance between the two sensing electrodes 13 of the measurement unit 17 and a variation in the electrical resistance between the two reference electrodes 19 of the reference unit 23.

As described above, the measurement unit 17 is operated in the same manner as the microsensor 9 implemented using only the measurement unit 17, as described above. Unlike the measurement unit 17, the reference unit 23 is characterized in that the operation unit 21 is not provided with the sensing contact member 15 and is made of only a nonconductor. Accordingly, even when the two sensing electrodes 13 of the measurement unit 17 are electrically connected to each other, as shown on the left side of FIG. 4, a high resistance value must be detected between the two reference electrodes 19. Further, even when the operation unit 21 has moved a significant distance away from the two reference electrodes 19, as shown in FIG. 3, there should be no variation in the resistance between the two reference electrodes 19.

That is, when there is a variation in the resistance between the two sensing electrodes 13 of the measurement unit 17, it is determined that the corresponding relay is normal only when the resistance between the two reference electrodes 19 of the reference unit 23 is continuously maintained in a constant state. In contrast, if the resistance between the reference electrodes 19 varies due to the malfunction or noise of the microsensor 9, it is determined that the relay is abnormal.

Preferably, the measurement unit 17 and the reference unit 23 may be arranged beside each other in the direction perpendicular to the movement direction of the movable unit 5, and may be operated in parallel and in conjunction with the operation of the movable unit 5.

Notably, the microsensor 9 may be manufactured by a semiconductor manufacturing process using a flexible silicon-based material such as polydimethylsiloxane (PDMS). Preferably, the sensing electrodes 13 and the sensing contact member 15 of the measurement unit 17 and the reference electrodes 19 and the operation unit 21 of the reference unit 23 may be individually sealed for the sake of guaranteeing safety, as shown in the drawings. That is, the to microsensor 9 is manufactured by a semiconductor manufacturing process using a flexible silicon-based material. The portion that causes a variation in an electrical physical quantity is configured as a completely sealed structure by means of a plasma process or the like, thus guaranteeing safety and reliability against the infiltration of foreign substances.

In the present embodiment, the movable unit 5 is composed of a contact core 25 made of a conductor that is in direct contact with the relay electrodes 11, and a sliding core 27 connected to be integrated with the contact core 25 and configured to slide along a linear path at the center of the coil 1. The microsensor 9 is installed between a fixed core 29 (part of fixed unit 7) for guiding the movable unit 5 along the linear path at the center of the coil 1 and providing a fixed location relative to the sliding core 27, and the sliding core 27.

In some exemplary embodiments of the present invention, the microsensor 9 may be implemented as an ultrasonic sensor or an infrared sensor according to conventional technologies, in addition to the above-described contact sensor.

Figure 5:
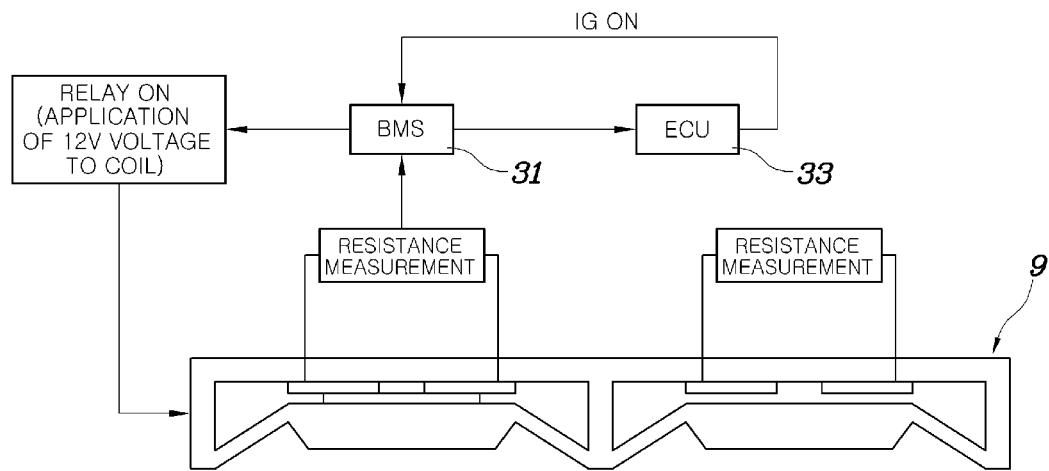
FIG. 5 is a diagram showing an exemplary concept of fault diagnosis using the relay module according to the present invention.

A power relay assembly for a battery system can be configured to include a positive main relay, a negative main relay, and an initial charging relay, each implemented as the relay module of the present invention having the above configuration. FIG. 5 schematically illustrates a configuration for inspecting each relay of the above power relay assembly. That is, the configuration for inspecting the relay can be implemented so that a BMS 31 can monitor the resistance values of the measurement unit 17 and the reference unit 23 of the microsensor 9 in real time. Furthermore, the BMS 31 can receive an ignition ON/OFF signal from an Engine Control Unit (ECU) 33 and supply power to the coil 1 of the relay or interrupt the supply of power. Doing so allows operation information about the BMS 31 to be provided to the ECU 33.

In the above-described configuration, the BMS 31 not only supplies power to the coil 1 depending on the ignition ON/OFF state of the ECU, but also measures and compares the resistances of the microsensor 9, as described above, thus immediately and directly determines whether the corresponding relay is normally operated.

For example, when the ECU 33 transmits an ignition ON signal, the BMS 31 diagnoses an error by measuring variations in the electrical resistances between the sensing electrodes 13 and between the reference electrodes 19 of each of the positive main relay, the negative main relay, and the initial charging relay while supplying power to the coil 1. For example, when a welding error occurs in the positive main relay, the sensing electrodes 13 of the positive main relay continuously exhibit a low resistance. The BMS 31 detects the low resistance and determines the error in the positive main relay to be due to a welding error, and thereafter notifies a user of such a error via a warning lamp or the like, thus enabling follow-up measurements, such as a recovery operation, to be taken.

As described above, the present invention can directly, accurately and promptly detect and identify an error in each relay constituting a power relay assembly when the error occurs in the relay, so that cost and time can be greatly reduced due to improvements in the operating efficiency of fault recovery. Furthermore, the exposure of a vehicle to unexpectedly dangerous situations can be prevented due to improvements in the reliability of fault recovery. In addition, the present invention can monitor the states of respective relays in real time, so that there is an improvement in the fault diagnosis performance of determining whether a fault lies in a failure in each relay itself, in a relay control circuit provided in a BMS, or in the short circuit or the disconnection of a control output wire, thus guaranteeing the safety of a vehicle system.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A relay module for a vehicle battery system, comprising:
   a movable unit configured to be moved via a magnetic field generated by a coil and a return spring within a relay and to control a state of an electrical connection between relay electrodes; and
   a microsensor installed between the movable unit and a fixed unit, the microsensor maintaining a fixed location relative to the movable unit, and configured to induce a variation in an electrical physical quantity depending on a variation in a location of the movable unit relative to the fixed unit,
   wherein the microsensor comprises:
      two sensing electrodes spaced apart from each other at a predetermined distance to enable an electrical resistance therebetween to be measured;
      a sensing contact member configured to, when the movable unit moves in a direction enabling the relay electrodes to be electrically connected to each other, move in a direction identical to that of the movable unit, to enable the two sensing electrodes to be electrically connected to each other;
      a measurement unit including the two sensing electrodes spaced apart from each other to enable an electrical resistance therebetween to be measured, and the sensing contact member configured to, when the movable unit moves in a direction enabling the relay electrodes to be electrically connected to each other, move in a direction identical to that of the movable unit and then enable the two sensing electrodes to be electrically connected to each other; and
      a reference unit including two reference electrodes spaced apart from each other to enable an electrical resistance therebetween to be measured, and an operation unit configured to,
      when the movable unit moves in a direction enabling the relay extrudes to be electrically connected to each other, move in a direction identical to that of the movable unit while operating in conjunction with the measurement unit.

2. The relay module of claim 1, wherein the operation unit is made of a nonconductor inhibiting the reference electrodes from being electrically connected.

3. The relay module according to claim 1, wherein the measurement unit and the reference unit are arranged beside each other in a direction perpendicular to a movement direction of the movable unit.

4. The relay module according to claim 1, wherein the microsensor is made of a flexible silicon-based material, and the sensing electrodes and the sensing contact member of the measurement unit, and the reference electrodes and the operation unit of the reference unit, are individually sealed.

5. The relay module according to claim 1, wherein the microsensor is made of a flexible silicon-based material, and a portion causing the variation in the electrical physical quantity is sealed.

6. The relay module according to claim 1, wherein:
   the movable unit includes a contact core made of a conductor in direct contact with the relay electrodes, and a sliding core connected to be integrated with the contact core and configured to slide along a linear path at a center of the coil, and
   the microsensor is installed between a fixed core that is the fixed unit for guiding the movable unit along the linear path at the center of the coil and providing a fixed location relative to the sliding core, and the sliding core.

7. The relay module according to claim 1, wherein the microsensor is implemented as an ultrasonic sensor.

8. The relay module according to claim 1, wherein the microsensor is implemented as an infrared sensor.

9. A power relay assembly for a battery system, comprising:
   a positive main relay, a negative main relay, and an initial charging relay, each implemented as the relay module in a circuit, each relay module including a movable unit configured to move via a magnetic field generated by a coil surrounding a core and a return spring within a relay, the movable unit controlling a state of an electrical connection between relay electrodes in the relay module; and a microsensor installed between the movable unit and a fixed unit, the microsensor maintaining a fixed location relative to the movable unit, and configured to induce a variation in an electrical physical quantity depending on a variation in a location of the movable unit relative to the fixed unit, wherein the microsensor comprises:

two sensing electrodes spaced apart from each other at a predetermined distance to enable an electrical resistance therebetween to be measured;

a sensing contact member configured to, when the movable unit moves in a direction enabling the relay electrodes to be electrically connected to each other, move in a direction identical to that of the movable unit, to enable the two sensing electrodes to be electrically connected to each other;

a measurement unit including the two sensing electrodes spaced apart from each other to enable an electrical resistance therebetween to be measured, and the sensing contact member configured to, when the movable unit moves in a direction enabling the relay electrodes to be electrically connected to each other, move in a direction identical to that of the movable unit and then enable the two sensing electrodes to be electrically connected to each other; and a reference unit including two reference electrodes spaced apart from each other to enable an electrical resistance therebetween to be measured, and an operation unit configured to, when the movable unit moves in a direction enabling the relay electrodes to be electrically connected to each other, move in a direction identical to that of the movable unit while operating in conjunction with the measurement unit.

10. The power relay assembly of claim 9, wherein the operation unit is made of a nonconductor inhibiting the reference electrodes from being electrically connected.

11. The power relay assembly according to claim 9, wherein the measurement unit and the reference unit are arranged beside each other in a direction perpendicular to a movement direction of the movable unit.

12. The power relay assembly according to claim 9, wherein the microsensor of each relay module is made of a flexible silicon-based material, and the sensing electrodes and the sensing contact member of the measurement unit, and the reference electrodes and the operation unit of the reference unit, are individually sealed.

13. The power relay assembly according to claim 9, wherein the microsensor of each relay module is made of a flexible silicon-based material, and a portion causing the variation in the electrical physical quantity is sealed.

14. The power relay assembly according to claim 9, wherein:

the movable unit includes a contact core made of a conductor in direct contact with the relay electrodes, and a sliding core connected to be integrated with the contact core and configured to slide along a linear path at a center of the coil, and the microsensor is installed between a fixed core that is the fixed unit for guiding the movable unit along the linear path at the center of the coil and providing a fixed location relative to the sliding core, and the sliding core.

15. The power relay assembly according to claim 9, wherein the microsensor of each relay module is implemented as an ultrasonic sensor.

16. The power relay assembly according to claim 9, wherein the microsensor of each relay module is implemented as an infrared sensor.

\* \* \* \* \*